US012795976B2

(12) United States Patent
Shimizu et al.

(10) Patent No.: US 12,795,976 B2
(45) Date of Patent: Nov. 10, 2026

(54) SEMICONDUCTOR DEVICE INCLUDING AN INTERMEDIATE ELECTRODE AND COMPOUND MEMBER

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Mariko Shimizu, Setagaya (JP); Yosuke Kajiwara, Yokohama (JP); Daimotsu Kato, Kawasaki (JP); Masahiko Kuraguchi, Yokohama (JP); Miyoko Shimada, Yokohama (JP); Hiroshi Ono, Setagaya (JP); Aya Shindome, Yokohama (JP); Ikuo Fujiwara, Yokohama (JP); Kento Minamikawa, Yokohama (JP); Peitsen Wu, Kawasaki (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 341 days.

(21) Appl. No.: 18/673,797

(22) Filed: May 24, 2024

(65) Prior Publication Data

US 2025/0159920 A1 May 15, 2025

(30) Foreign Application Priority Data

Nov. 13, 2023 (JP) ................................ 2023-192904

(51) Int. Cl.

| | |
|---|---|
| ***H10D 30/47*** | (2025.01) |
| ***H10D 62/85*** | (2025.01) |
| ***H10D 64/27*** | (2025.01) |

(52) U.S. Cl.

CPC ....... *H10D 30/475* (2025.01); *H10D 62/8503* (2025.01); *H10D 64/411* (2025.01)

(58) Field of Classification Search

CPC .......................... H10D 62/405; H10D 64/513

See application file for complete search history.

(56) References Cited

U.S. PATENT DOCUMENTS

| | | | |
|---|---|---|---|
| 9,312,350 | B2 | 4/2016 | Minoura et al. |
| 10,373,833 | B2 | 8/2019 | Shindome et al. |

(Continued)

FOREIGN PATENT DOCUMENTS

| | | | |
|---|---|---|---|
| JP | 2011-529639 | A | 12/2011 |
| JP | 2013-168869 | A | 8/2013 |

(Continued)

OTHER PUBLICATIONS

Kodama, M, et al., "GaN-Based Trench Gate Metal Oxide Semiconductor Field-Effect Transistor Fabricated with Novel Wet Etching", Appl. Phys. Express 1, 2008, 4 pages.

*Primary Examiner* — William B Partridge
*Assistant Examiner* — Felix B Andrews
(74) *Attorney, Agent, or Firm* — Oblon, McClelland, Maier & Neustadt, L.L.P.

(57) ABSTRACT

According to one embodiment, a semiconductor device includes a first electrode, a second electrode, a third electrode, a first semiconductor layer, a second semiconductor layer, and a compound member. The third electrode includes a first electrode portion. The first semiconductor layer includes $Al_{x1}Ga_{1-x1}N$ ($0 \leq x1 < 1$). The first semiconductor layer includes a first partial region, a second partial region, a third partial region, a fourth partial region, and a fifth partial region. The second semiconductor layer includes $Al_{x2}Ga_{1-x2}N$ ($0 < x2 < 1$, $x1 < x2$). The second semiconductor layer includes a first semiconductor portion and a second semiconductor portion. The compound member includes (Continued)

$Al_{z1}Ga_{1-z1}N$ ($0<z1\leq1$, $x2<z1$). The compound member includes a first region, a second region, and a third region.

20 Claims, 5 Drawing Sheets

(56) References Cited

U.S. PATENT DOCUMENTS

| | | | | |
|---|---|---|---|---|
| 2010/0025730 | A1 | 2/2010 | Heikman et al. | |
| 2013/0214603 | A1 | 8/2013 | Tanaka | |
| 2014/0346525 | A1 | 11/2014 | Minoura et al. | |
| 2015/0048419 | A1 | 2/2015 | Okamoto et al. | |
| 2020/0027978 | A1* | 1/2020 | Kajiwara | H10D 30/015 |
| 2020/0295169 | A1 | 9/2020 | Kato et al. | |
| 2020/0335587 | A1* | 10/2020 | Ono | H10D 30/4732 |
| 2020/0373422 | A1* | 11/2020 | Kuraguchi | H10D 30/015 |
| 2022/0123135 | A1 | 4/2022 | Smith et al. | |
| 2022/0130986 | A1* | 4/2022 | Kato | H10D 30/475 |
| 2022/0140125 | A1* | 5/2022 | Kato | H10D 30/475<br>257/76 |
| 2022/0285525 | A1 | 9/2022 | Horikiri et al. | |
| 2022/0384614 | A1 | 12/2022 | Ichikawa et al. | |

FOREIGN PATENT DOCUMENTS

| | | | |
|---|---|---|---|
| JP | 2014-229838 | A | 12/2014 |
| JP | 2015-37148 | A | 2/2015 |
| JP | 2016-181570 | A | 10/2016 |
| JP | 2020-150141 | A | 9/2020 |
| JP | 2021-22703 | A | 2/2021 |
| JP | 2021-77818 | A | 5/2021 |
| JP | 2022-66768 | A | 5/2022 |

* cited by examiner

SEMICONDUCTOR DEVICE INCLUDING AN INTERMEDIATE ELECTRODE AND COMPOUND MEMBER

CROSS-REFERENCE TO RELATED APPLICATIONS

This application is based upon and claims the benefit of priority from Japanese Patent Application No. 2023-192904, filed on Nov. 13, 2023; the entire contents of which are incorporated herein by reference.

FIELD

Embodiments described herein relate generally to a semiconductor device.

BACKGROUND

For example, it is desired to improve the characteristics of semiconductor devices such as transistors.

DETAILED DESCRIPTION

Figure 1:
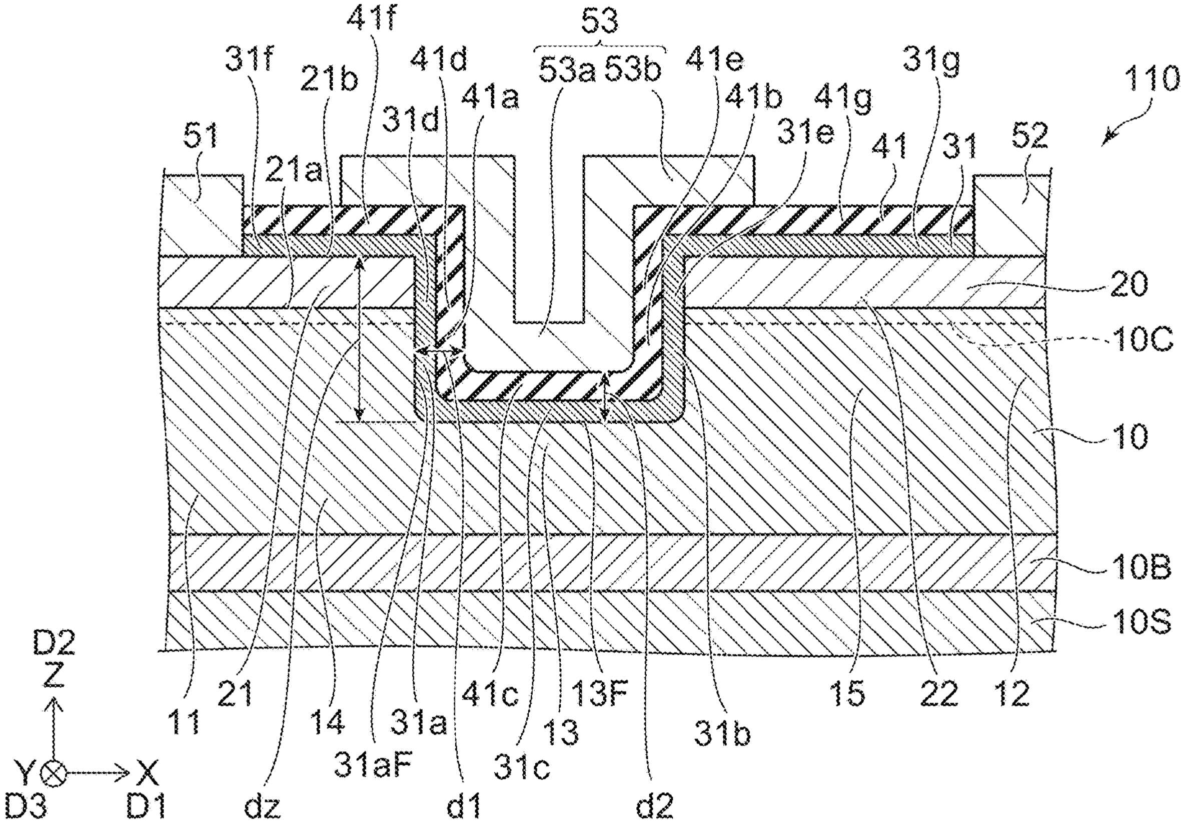
FIG. 1 is a schematic cross-sectional view illustrating a semiconductor device according to a first embodiment.

According to one embodiment, a semiconductor device includes a first electrode, a second electrode, a third electrode, a first semiconductor layer, a second semiconductor layer, and a compound member. The third electrode includes a first electrode portion. A position of the third electrode in a first direction from the first electrode to the second electrode is between a position of the first electrode in the first direction and a position of the second electrode in the first direction. The first semiconductor layer includes $Al_{x1}Ga_{1-x1}N$ ($0 \le x1 < 1$). The first semiconductor layer includes a first partial region, a second partial region, a third partial region, a fourth partial region, and a fifth partial region. A second direction from the first partial region to the first electrode crosses the first direction, A direction from the second partial region to the second electrode is along the second direction. A direction from the third partial region to the first electrode portion is along the second direction. A position of the fourth partial region in the first direction is between a position of the first partial region in the first direction and a position of the third partial region in the first direction. A position of the fifth partial region in the first direction is between the position of the third partial region in the first direction and a position of the second partial region in the first direction. The second semiconductor layer includes $Al_{x2}Ga_{1-x2}N$ ($0 < x2 < 1$, $x1 < x2$). The second semiconductor layer includes a first semiconductor portion and a second semiconductor portion. A direction from the fourth partial region to the first semiconductor portion is along the second direction. A direction from the fifth partial region to the second semiconductor portion is along the second direction. The compound member includes $Al_{z1}Ga_{1-z1}N$ ($0 < z1 \le 1$, $x2 < z1$). The compound member includes a first region, a second region, and a third region. The first region is between the fourth partial region and the first electrode portion in the first direction. The second region is between the first electrode portion and the fifth partial region in the first direction. The third region is between the third partial region and the first electrode portion. A first absolute value of a first difference between a (10-10) inter-plane spacing in the first region and a (10-10) inter-plane spacing in the fourth partial region is greater than a third absolute value of a third difference between a (10-10) inter-plane spacing in the third region and a (10-10) inter-plane spacing in the third partial region.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

FIG. 1 is a schematic cross-sectional view illustrating a semiconductor device according to a first embodiment.

As shown in FIG. 1, a semiconductor device 110 according to the embodiment includes a first electrode 51, a second electrode 52, a third electrode 53, a first semiconductor layer 10, a second semiconductor layer 20, and a compound member 31.

The third electrode 53 includes a first electrode portion 53*a*. A first direction D1 from the first electrode 51 to the second electrode 52 is defined as an X-axis direction. One direction perpendicular to the X-axis direction is defined as a Z-axis direction. A direction perpendicular to the X-axis direction and the Z-axis direction is defined as a Y-axis direction.

A position of the third electrode 53 in the first direction D1 is between a position of the first electrode 51 in the first direction D1 and a position of the second electrode 52 in the first direction D1. For example, the third electrode 53 is between the first electrode 51 and the second electrode 52 in the first direction D1. The first electrode 51, the second electrode 52, and the third electrode 53 may extend, for example, along a third direction D3 (for example, the Y-axis direction).

The first semiconductor layer 10 includes $Al_{x1}Ga_{1-x1}N$ ($0 \le x1 < 1$). The composition ratio x1 is, for example, not less than 0 and not more than 0.05. The first semiconductor layer 10 may be, for example, a GaN layer. The first semiconductor layer 10 may not include, for example, an impurity that provides conductivity.

The first semiconductor layer 10 includes a first partial region 11, a second partial region 12, a third partial region 13, a fourth partial region 14, and a fifth partial region 15. A second direction D2 from the first partial region 11 to the first electrode 51 crosses the first direction D1. The second direction D2 is, for example, the Z-axis direction. For example, the third direction D3 crosses a plane including the first direction D1 and the second direction D2.

A direction from the second partial region 12 to the second electrode 52 is along the second direction D2. A direction from the third partial region 13 to the first electrode portion 53*a* is along the second direction D2.

A position of the fourth partial region 14 in the first direction D1 is between a position of the first partial region 11 in the first direction D1 and a position of the third partial region 13 in the first direction D1. A position of the fifth partial region 15 in the first direction D1 is between the position of the third partial region 13 in the first direction D1 and a position of the second partial region 12 in the first direction D1.

The second semiconductor layer 20 includes $Al_{x2}Ga_{1-x2}N$ ($0<x2<1$, $x1<x2$). The composition ratio x2 is, for example, not less than 0.15 and not more than 0.35. The second semiconductor layer 20 may be, for example, an AlGaN layer. The second semiconductor layer 20 may not need include, for example, an impurity that provides conductivity.

The second semiconductor layer 20 includes a first semiconductor portion 21 and a second semiconductor portion 22. A direction from the fourth partial region 14 to the first semiconductor portion 21 is along the second direction D2. A direction from the fifth partial region 15 to the second semiconductor portion 22 is along the second direction D2.

The compound member 31 includes $Al_{z1}Ga_{1-z1}N$ ($0<z1\leq 1$, $x2<z1$). The composition ratio z1 may be, for example, not less than 0.9 and not more than 1. The composition ratio z1 may be substantially 1, for example. The compound member 31 may be, for example, an AlN layer.

The compound member 31 includes a first region 31*a*, a second region 31*b*, and a third region 31*c*. The first region 31*a* is located between the fourth partial region 14 and the first electrode portion 53*a* in the first direction D1. The second region 31*b* is located between the first electrode portion 53*a* and the fifth partial region 15 in the first direction D1. The third region 31*c* is located between the third partial region 13 and the first electrode portion 53*a* in the second direction D2.

The first semiconductor layer 10, the second semiconductor layer 20, and the compound member 31 include crystals.

In the embodiment, current flowing between the first electrode 51 and the second electrode 52 is controlled by a potential of the third electrode 53. The potential of the third electrode 53 may be based on a potential of the first electrode 51.

The first electrode 51 functions, for example, as a source electrode. The second electrode 52 functions, for example, as a drain electrode. The third electrode 53 functions as, for example, a gate electrode. The semiconductor device 110 is, for example, a transistor.

As shown in FIG. 1, the first semiconductor layer 10 includes a region facing the second semiconductor layer 20. A carrier region 10C is formed in this region. The carrier region 10C is, for example, a two-dimensional electron gas. The semiconductor device 110 is, for example, a HEMT (High Electron Mobility Transistor).

As shown in FIG. 1, the first electrode portion 53*a* is located between the fourth partial region 14 and the fifth partial region 15 in the first direction D1. For example, a recess (for example, a trench) is formed in the semiconductor member including the first semiconductor layer 10 and the second semiconductor layer 20. The compound member 31 and the like are formed inside the recess, and the third electrode 53 is formed in the remaining space. The third electrode 53 is, for example, a recessed gate electrode. For example, a high threshold voltage can be obtained. For example, normally-off operation is obtained.

For example, the first region 31*a* and the fourth partial region 14 correspond to a side face of the recess. The second region 31*b* and the fifth partial region 15 correspond to other side face of the recess. The third partial region 13 and the third region 31*c* correspond to the bottom of the recess.

In the embodiment, a difference between the (10-10) inter-plane spacing in the first region 31*a* and a (10-10) inter-plane spacing in the fourth partial region 14 is defined as a first difference Δa1. A difference between the (10-10) inter-plane spacing in the third region 31*c* and a (10-10) inter-plane spacing in the third partial region 13 is defined as a third difference Δa3. In the embodiment, a first absolute value of the first difference Δa1 is greater than a third absolute value of the third difference Δa3. The description "(10-10) plane" indicates that a "bar" is added to the number after the "-".

In the portion corresponding to the side face of the recess, the difference in (10-10) inter-plane spacing (the first difference Δa1) between the compound member 31 and the first semiconductor layer 10 is large. In the portion corresponding to the bottom of the recess, the difference in (10-10) inter-plane spacing (the third difference Δa3) between the compound member 31 and the first semiconductor layer 10 is small.

The difference in crystal lattice length is small in the portion corresponding to the bottom of the recess. Thereby, for example, high crystallinity can be obtained in the third partial region 13. Thereby, it becomes easy to obtain high mobility. For example, low on-resistance can be obtained. According to the embodiment, a semiconductor device with improved characteristics can be provided.

On the other hand, the difference in crystal lattice length is large in the portion corresponding to the side face of the recess. For example, on the sides of the recess, the (10-10) inter-plane spacings do not match. Thereby, generation of carriers on the side of the recess is suppressed. Thereby, it becomes easier to obtain a high threshold voltage. For example, it becomes easier to stably obtain a high threshold voltage. According to the embodiment, a semiconductor device with improved characteristics can be provided.

In the embodiment, the second direction D2 crosses the (0001) plane of the crystal included in the first semiconductor layer 10. The angle between the second direction D2 and the (0001) plane is, for example, not less than 85 degrees and not more than 95 degrees. The first direction D1 may cross, for example, the (10-10) plane of the crystal included in the first semiconductor layer 10. The angle between the first direction D1 and the (10-10) plane is, for example, not less than 85 degrees and not more than 95.

As shown in FIG. 1, the compound member 31 may further include a fourth region 31*d* and a fifth region 31*e*. The fourth region 31*d* is located between the first semiconductor portion 21 and the first electrode portion 53*a* in the first direction D1. The fifth region 31*e* is located between the first electrode portion 53*a* and the second semiconductor portion 22 in the first direction D1. For example, the fourth region 31*d* is in contact with the first semiconductor portion 21. The fifth region 31*e* is in contact with the second semiconductor portion 22.

The compound member 31 may further include a sixth region 31*f* and a seventh region 31*g*. The first semiconductor portion 21 is provided between the fourth partial region 14 and the sixth region 31*f*. The second semiconductor portion 22 is provided between the fifth partial region 15 and the seventh region 31*g*.

As shown in FIG. 1, the semiconductor device 110 may further include a first insulating member 41. The first insulating member 41 includes a first insulating region 41*a*, a second insulating region 41*b*, and a third insulating region 41*c*. The first insulating region 41*a* is provided between the first region 31*a* and the first electrode portion 53*a* in the first direction D1. The second insulating region 41*b* is provided between the first electrode portion 53*a* and the second region 31*b* in the first direction D1. The third insulating region 41*c* is provided between the third region 31*c* and the first electrode portion 53*a* in the second direction D2.

The first insulating member 41 may further include a fourth insulating region 41*d* and a fifth insulating region 41*e*. The fourth insulating region 41*d* is provided between the fourth region 31*d* and the first electrode portion 53*a* in the first direction D1. The fifth insulating region 41*e* is provided between the first electrode portion 53*a* and the fifth region 31*e* in the first direction D1.

The first insulating member 41 may further include a sixth insulating region 41*f* and a seventh insulating region 41*g*. The sixth region 31*f* is provided between the first semiconductor portion 21 and the sixth insulating region 41*f*. The seventh region 31*g* is provided between the second semiconductor portion 22 and the seventh insulating region 41*g*.

Hereinafter, examples of characteristics of semiconductor devices will be described.

Figure 2A:
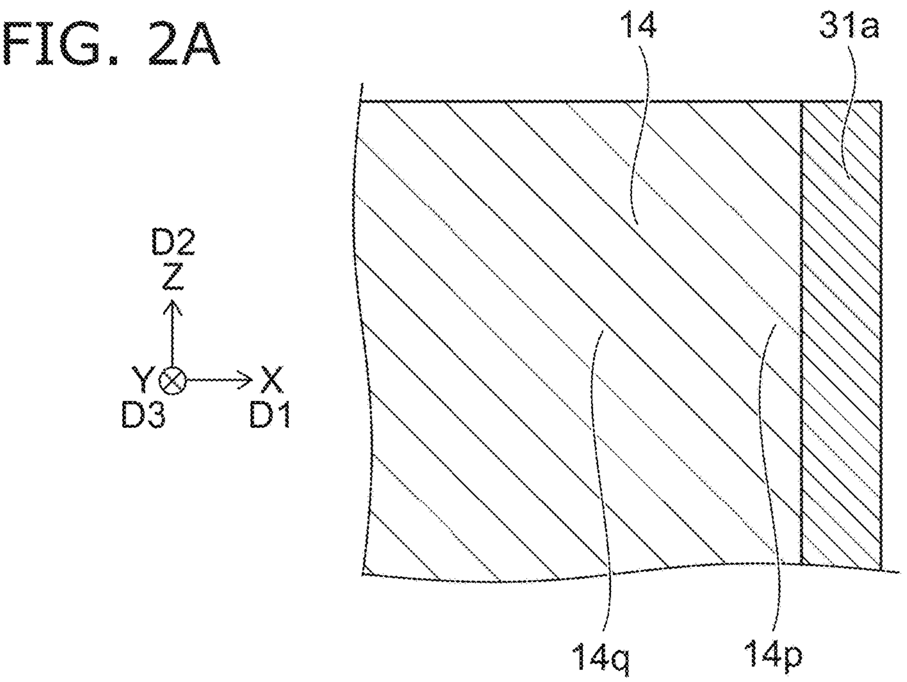
FIGS. 2A and 2B are schematic cross-sectional views illustrating evaluation positions of a semiconductor device.
Figure 2B:
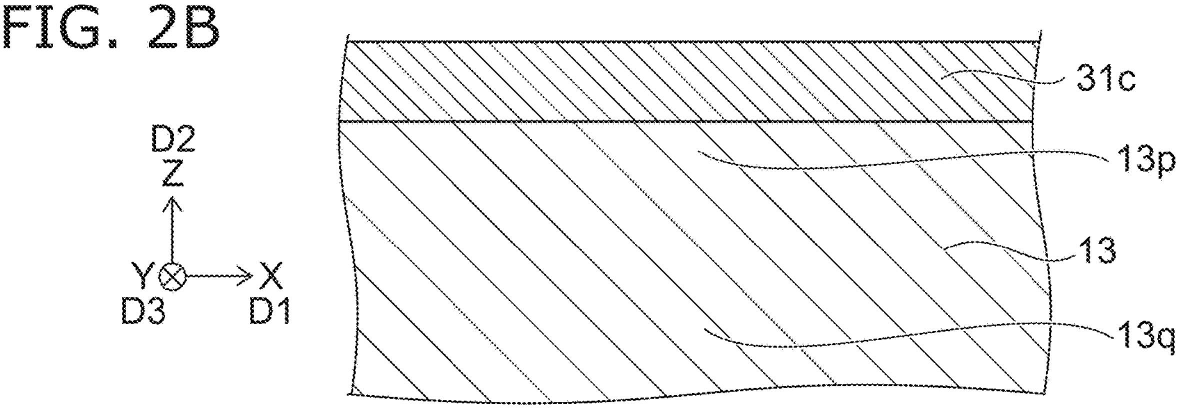

FIGS. 2A and 2B are schematic cross-sectional views illustrating evaluation positions of a semiconductor device.

As shown in FIG. 2A, the fourth partial region 14 includes a first position 14*p* and a second position 14*q*. The first position 14*p* is located between the second position 14*q* and the first region 31*a* in the first direction D1. A distance along the first direction D1 between the first position 14*p* and the first region 31*a* is 1 nm. A distance along the first direction D1 between the second position 14*q* and the first region 31*a* is 10 nm.

As shown in FIG. 2B, the third partial region 13 includes a third position 13*p* and a fourth position 13*q*. The third position 13*p* is located between the fourth position 13*q* and the third region 31*c* in the second direction D2. A distance along the second direction D2 between the third position 13*p* and the third region 31*c* is 1 nm. A distance along the second direction D2 between the fourth position 13*q* and the third region 31*c* is 10 nm.

FIGS. 3A to 3D are graphs illustrating characteristics of a semiconductor device.

Figure 3A:
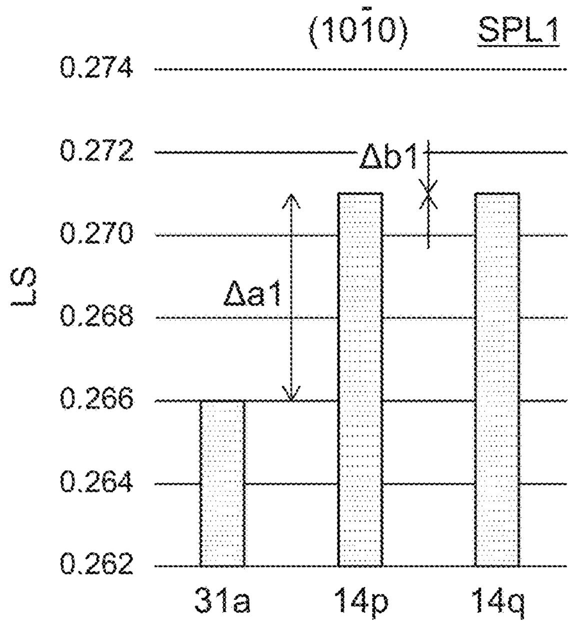
FIGS. 3A to 3D are graphs illustrating characteristics of a semiconductor device.
Figure 3C:
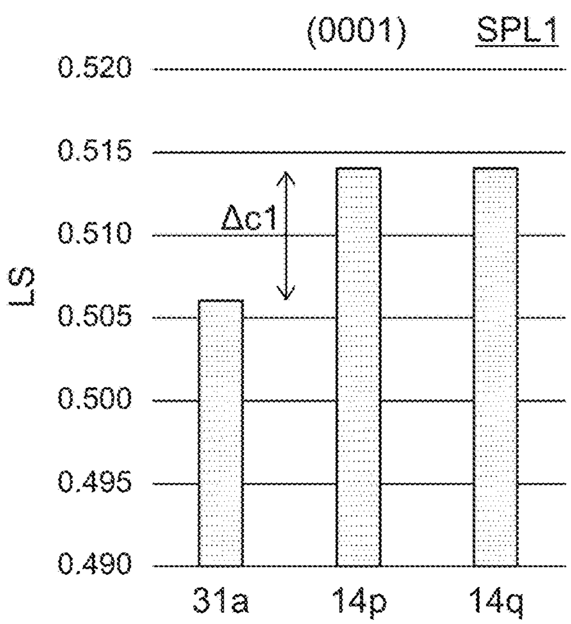
Figure 3B:
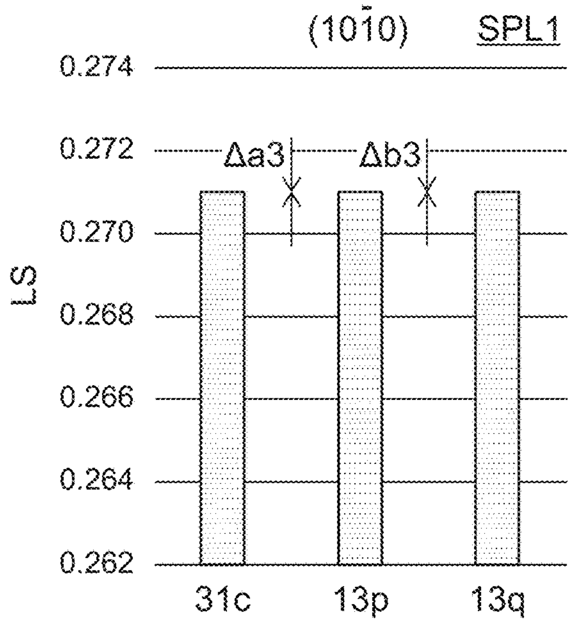
Figure 3D:
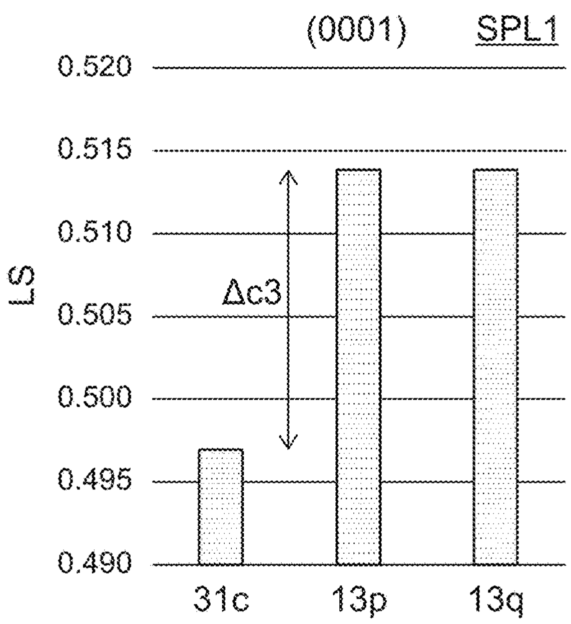

These figures illustrate evaluation results of the first sample SPL1. The vertical axes are the inter-plane spacing LS. FIG. 3A shows the measurement results of the (10-10) inter-plane spacing in the first region 31*a*, the first position 14*p*, and the second position 14*q*. FIG. 3B shows the measurement results of the (10-10) inter-plane spacing in the third region 31*c*, the third position 13*p*, and the fourth position 13*q*. FIG. 3C shows the measurement results of the (0001) inter-plane spacing in the first region 31*a*, the first position 14*p*, and the second position 14*q*. FIG. 3D shows the measurement results of the (0001) inter-plane spacing in the third region 31*c*, the third position 13*p*, and the fourth position 13*q*. The inter-plane spacing is obtained by electron diffraction.

In FIGS. 3A and 3C, the value of the inter-plane spacing in the first region 31*a* is a value at a position 1 nm from the boundary between the fourth partial region 14 and the first region 31*a*. In FIGS. 3B and 3D, the value of the inter-plane spacing in the third region 31*c* is a value at a position 1 nm from the boundary between the third partial region 13 and the third region 31*c*. The first sample SPL1 corresponds to the semiconductor device 110 according to the embodiment.

As shown in FIG. 3A, in the first sample SPL1, the value of the (10-10) inter-plane spacing is substantially constant at the first position 14*p* and the second position 14*q*. As shown in FIG. 3B, in the first sample SPL1, the value of the (10-10) inter-plane spacing is substantially constant at the third position 13*p* and the fourth position 13*q*. As shown in FIG. 3C, in the first sample SPL1, the value of the (0001) inter-plane spacing is substantially constant at the first position 14*p* and the second position 14*q*. As shown in FIG. 3D, in the first sample SPL1, the value of the (0001) inter-plane spacing is substantially constant at the third position 13*p* and the fourth position 13*q*.

As shown in FIG. 3A, in the first sample SPL1, the (10-10) inter-plane spacing in the first region 31*a* is smaller than the (10-10) inter-plane spacing in the fourth partial region 14 (first position 14*p* and second position 14*q*). The difference between the (10-10) inter-plane spacing in the first region 31*a* and the (10-10) inter-plane spacing in the fourth partial region 14 corresponds to the first difference Δa1.

As shown in FIG. 3B, in the first sample SPL1, the (10-10) inter-plane spacing in the third region 31*c* is substantially the same as the (10-10) inter-plane spacing in the third partial region 13 (third position 13*p* and fourth position 13*q*). The difference between the (10-10) inter-plane spacing in the third region 31*c* and the (10-10) inter-plane spacing in the third partial region 13 corresponds to the third difference Δa3.

Thus, in the first sample SPL1, the first absolute value of the first difference Δa1 is larger than the third difference Δa3. Thereby, it becomes easy to obtain high mobility. For example, low on-resistance can be obtained. For example, it becomes easier to stably obtain a high threshold voltage.

As shown in FIG. 3C, in the first sample SPL1, the (0001) inter-plane spacing in the first region 31*a* is smaller than the (0001) inter-plane spacing in the fourth partial region 14 (first position 14*p* and second position 14*q*). The difference between the (0001) inter-plane spacing in the first region 31*a* and the (0001) inter-plane spacing in the fourth partial region 14 corresponds to the difference Δc1.

As shown in FIG. 3D, in the first sample SPL1, the (0001) inter-plane spacing in the third region 31*c* is smaller than the (0001) inter-plane spacing in the third partial region 13 (the third position 13*p* and the fourth position 13*q*). The difference between the (0001) inter-plane spacing in the third region 31*c* and the (0001) inter-plane spacing in the third partial region 13 corresponds to the difference Δc3.

For example, it is considered that a large difference Δc3 with respect to the (0001) inter-plane spacing at the bottom of the recess effectively relieves the distortion and reduces the third difference Δa3 with respect to the (10-10) inter-plane spacing.

In the first sample SPL1, the difference Δc3 is larger than the difference Δc1. It is considered that the large difference Δc3 alleviates the distortion more effectively.

It is thought that the large first difference Δa1 regarding the (10-10) inter-plane spacing on the side faces of the recess will alleviate the strain and effectively reduce the third difference Δa3 regarding the (10-10) inter-plane spacing at the bottom of the recess.

Thus, in the embodiment, the absolute value of the difference Δc1 between the (0001) inter-plane spacing in the first region 31*a* and the (0001) inter-plane spacing in the fourth partial region 14 may be greater than the third absolute value of the third difference Δa3.

The absolute value of the difference Δc3 between the (0001) inter-plane spacing in the third region 31*c* and the (0001) inter-plane spacing in the third partial region 13 may be greater than the third absolute value of the third difference Δa3.

The relationship between the lattice spacings in the second region 31*b* and the fifth partial region 15 may be substantially the same as the relationship between the lattice spacings in the first region 31*a* and the fourth partial region 14.

For example, a difference between the (10-10) inter-plane spacing in the second region 31*b* and the (10-10) inter-plane spacing in the fifth partial region 15 is defined as a second difference. A second absolute value of the second difference is greater than the third absolute value of the third difference Δa3. The second difference may be substantially the same as the first difference Δa1.

For example, the absolute value of the difference between the (0001) inter-plane spacing in the second region 31*b* and the (0001) inter-plane spacing in the fifth partial region 15 may be greater than the third absolute value of the third difference Δa3.

In the first sample SPL1, the first absolute value of the first difference Δa1 is about 0.005 nm. In the embodiment, the first absolute value of the first difference Δa1 may be 0.003 nm or more. In the first sample SPL1, the third absolute value of the third difference Δa3 is less than or equal to 0.0001 nm. In the embodiment, the third absolute value of the third difference Δa3 may be less than 0.001 nm. In the embodiment, the third absolute value of the third difference Δa3 may be 0.0005 nm or less.

In the embodiment, for example, the first absolute value of the first difference Δa1 may be three times or more the third absolute value of the third difference Δa3. In one example, the first absolute value may be less than or equal to 1000 times the third absolute value.

In the embodiment, for example, the absolute value of the difference Δb1 between the (10-10) inter-plane spacing at the first position 14*p* and the (10-10) inter-plane spacing at the second position 14*q* is smaller than the first absolute value of the first difference Δa1 (see FIG. 3A).

In the embodiment, for example, the absolute value of the difference Δb3 between the (10-10) inter-plane spacing at the third position 13*p* and the (10-10) inter-plane spacing at the fourth position 13*q* is smaller than the first absolute value of the first difference Δa1 (see FIG. 3B).

FIGS. 4A to 4D are graphs illustrating characteristics of a semiconductor device.

Figure 4A:
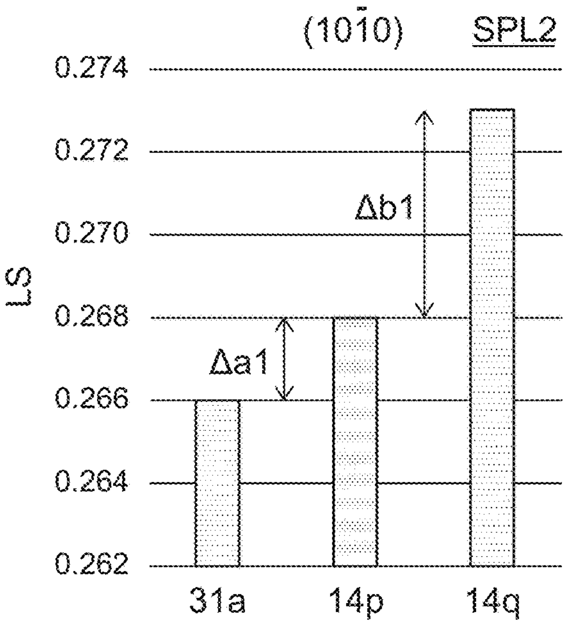
FIGS. 4A to 4D are graphs illustrating characteristics of a semiconductor device.
Figure 4C:
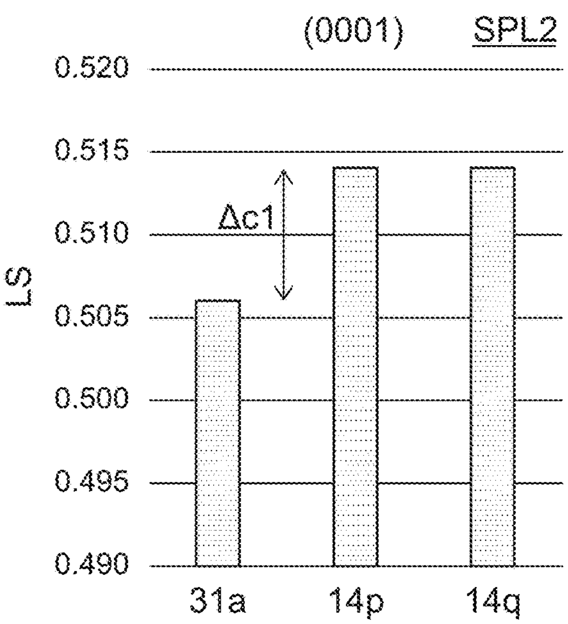
Figure 4B:
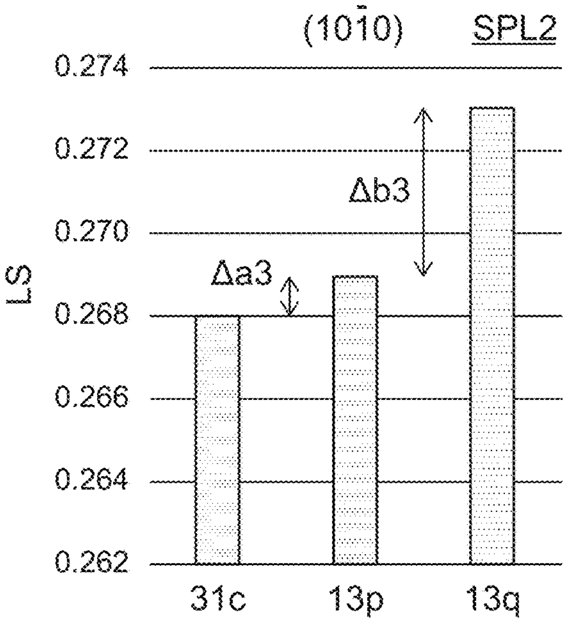
Figure 4D:
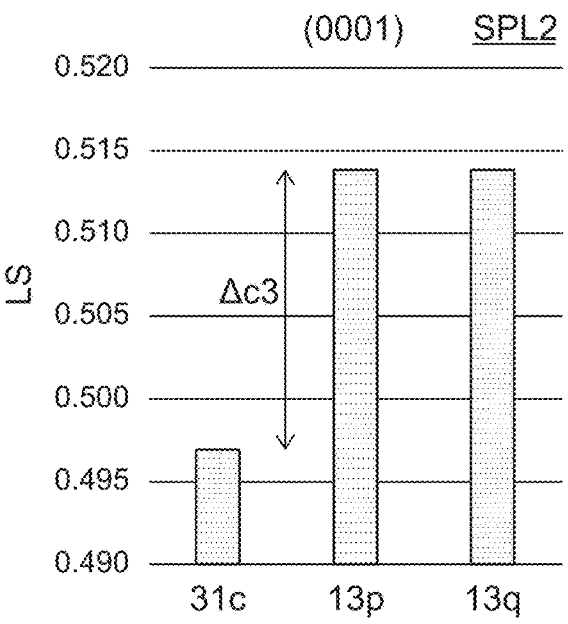

These figures illustrate evaluation results of the second sample SPL2. The vertical axes are the inter-plane spacing LS. FIG. 4A shows the measurement results of the (10-10) inter-plane spacing in the first region 31*a*, the first position 14*p*, and the second position 14*q*. FIG. 4B shows the measurement results of the (10-10) inter-plane spacing in the third region 31*c*, the third position 13*p*, and the fourth position 13*q*. FIG. 4C shows the measurement results of the (0001) inter-plane spacing in the first region 31*a*, the first position 14*p*, and the second position 14*q*. FIG. 4D shows the measurement results of the (0001) inter-plane spacing in the third region 31*c*, the third position 13*p*, and the fourth position 13*q*.

In the first sample SPL1 described above, a part of the semiconductor layer is removed by dry etching to form a recess, and then an alkali wet treatment is performed. On the other hand, in the second sample SPL2, the above-mentioned alkali wet treatment is omitted.

As shown in FIG. 4A, in the second sample SPL2, the value of the (10-10) inter-plane spacing is significantly different between the first position 14*p* and the second position 14*q*. As shown in FIG. 4B, in the second sample SPL2, the value of the (10-10) inter-plane spacing is significantly different between the third position 13*p* and the fourth position 13*q*.

In such a second sample SPL2, the (10-10) inter-plane spacing in the fourth partial region 14 is, for convenience, the (10-10) inter-plane spacing at the first position 14*p*. In such a second sample SPL2, the (10-10) inter-plane spacing in the third partial region 13 is conveniently set to the (10-10) inter-plane spacing at the third position 13*p*.

In the second sample SPL2, the first difference Δa1 between the (10-10) inter-plane spacing in the first region 31*a* and the (10-10) inter-plane spacing in the fourth partial region 14 is approximately 0.002. In the second sample SPL2, the third difference Δa3 between the (10-10) inter-plane spacing in the third region 31*c* and the (10-10) inter-plane spacing in the third partial region 13 is about 0.001 nm. Therefore, also in the second sample SPL2, the first absolute value of the first difference Δa1 is larger than the third absolute value of the third difference Δa3. Therefore, it is considered that high mobility and high threshold values can be obtained.

However, in the second sample SPL2, the difference between the first difference Δa1 and the third difference Δa3 is small.

As already explained, in the first sample SPL1, the first difference Δa1 is about 0.005 nm, the third difference Δa3 is 0.0001 nm or less, and the difference between these values is large. In the first sample SPL1, higher mobility can be obtained compared to the second sample SPL2. Higher threshold values are stably obtained. In the embodiment, the first absolute value of the first difference Δa1 is preferably 0.002 nm or more. In the embodiment, the third absolute value of the third difference Δa3 is preferably less than 0.001 nm. The third absolute value of the third difference Δa3 is more preferably 0.0005 nm or less.

As shown in FIG. 4A, in the second sample SPL2, for example, the absolute value of the difference Δb1 between the (10-10) inter-plane spacing at the first position 14*p* and the (10-10) inter-plane spacing at the second position 14*q* is larger than the first absolute value of the first difference Δa1. In the second sample SPL2, the absolute value of the difference Δb1 is larger than the third absolute value of the third difference Δa3.

As described above, in the second sample SPL2, the (10-10) inter-plane spacing greatly differs between the first position 14*p* and the second position 14*q*. In the second sample SPL2, the crystal quality in the fourth partial region 14 is considered to be lower than the crystal quality in the fourth partial region 14 in the first sample SPL1.

As shown in FIG. 4B, in the second sample SPL2, for example, the absolute value of the difference Δb3 between the (10-10) inter-plane spacing at the third position 13*p* and the (10-10) inter-plane spacing at the fourth position 13*q* is larger than the first absolute value of the first difference Δa1. In the second sample SPL2, the absolute value of the difference Δb3 is larger than the third absolute value of the third difference Δa3.

As described above, in the second sample SPL2, the (10-10) inter-plane spacing greatly differs between the third position 13*p* and the fourth position 13*q*. In the second sample SPL2, the crystal quality in the third partial region 13 is considered to be lower than the crystal quality in the third partial region 13 in the first sample SPL1.

The inter-plane spacing (lattice spacing) as described above is obtained by, for example, optimizing the conditions of dry etching and wet etching at the time of forming the recess, the conditions of forming the compound member 31, and the like. For example, by setting the condition of the dry etching to low power, roughness of the surface after the dry etching is suppressed, and the inter-plane spacing as in the first sample SPL1 is easily obtained. For example, by optimizing the conditions of the wet etching, high flatness can be obtained, and the inter-plane spacing as in the first sample SPL1 can be easily obtained. By optimizing the temperature, the flow rate of the raw material gas, and the like in the formation of the compound member 31, the inter-plane spacing as in the first sample SPL1 is easily obtained. These conditions may be optimized in consideration of characteristics unique to each of the dry etching apparatus, the wet etching apparatus, and the film forming apparatus. For example, by measuring the lattice spacing of a sample produced by changing the conditions of each apparatus, it is possible to determine appropriate conditions in each apparatus.

In the embodiment, the ratio of the third absolute value of the third difference Δa3 to the (10-10) inter-plane spacing in the third partial region 13 may be, for example, 0.001 or less. By the third difference Δa3 being small, for example, high crystallinity can be obtained in the third partial region 13. High mobility can be obtained.

In the embodiment, the first absolute value of the first difference Δa1 may be two times or more the third absolute value of the third difference Δa3. The first absolute value may be 50 times or less the third absolute value.

As shown in FIG. 1, the third partial region 13 includes a third partial region face 13F that faces the third region 31*c*. The third partial region face 13F is, for example, along the c-plane of the first semiconductor layer 10.

The first region 31*a* includes a first region face 31*a*F facing the fourth partial region 14. In the embodiment, the first region face 31*a*F may be a nonpolar face or a semipolar face. The first region face 31*a*F may be, for example, an a-plane or an m-plane.

As shown in FIG. 1, the semiconductor device 110 may include a base 10S and a nitride layer 10B. The base 10S may be, for example, a silicon substrate. The nitride layer 10B is provided between the base 10S and the first semiconductor layer 10. The nitride layer 10B includes, for example, Al, Ga, and N. The nitride layer 10B is, for example, a buffer layer.

The first electrode 51 is electrically connected to the first semiconductor portion 21, for example. The second electrode 52 is electrically connected to the second semiconductor portion 22, for example.

As shown in FIG. 1, the first semiconductor portion 21 includes a first face 21*a* and a first other face 21*b*. The first face 21*a* is located between the fourth partial region 14 and the first other face 21*b* in the second direction D2. The first face 21*a* faces the fourth partial region 14. As already explained, the third partial region 13 includes the third partial region face 13F that faces the third region 31*c*. A distance in the second direction D2 between the position of the third partial region face 13F in the second direction D2 and the position of the first other face 21*b* in the second direction D2 is defined as a distance dz. The distance dz corresponds to the recess depth. In the embodiment, the distance dz may be, for example, 100 nm or more. For example, it is easy to obtain a high threshold voltage.

In the embodiment, the thickness of the second semiconductor layer 20 along the second direction D2 may be, for example, not less than 10 nm and not more than 60 nm. It is easy to obtain the carrier region 10C being stable.

As shown in FIG. 1, a distance along the first direction D1 between the fourth partial region 14 and the first electrode portion 53*a* is defined as a first distance d1. A distance along the second direction D2 between the third partial region 13 and the first electrode portion 53*a* is defined as a second distance d2. The first distance d1 may be substantially the same as the second distance d2. For example, the first distance d1 may be not less than 0.8 times and not more than 1.2 times the second distance d2.

As shown in FIG. 1, the third electrode 53 may further include a second electrode portion 53*b*. The second electrode portion 53*b* is continuous with the first electrode portion 53*a*. In the second direction D2, a part of the second semiconductor portion 22 may be provided between a part of the fifth partial region 15 and the second electrode portion 53*b*. For example, in the second direction D2, a part of the first semiconductor portion 21 may be provided between a part of the fourth partial region 14 and the second electrode portion 53*b*.

The first insulating member 41 includes, for example, at least one selected from the group consisting of silicon and aluminum, and at least one selected from the group consisting of oxygen and nitrogen. The first insulating member 41 may include, for example, silicon oxide, silicon nitride, silicon oxynitride, aluminum oxide, or the like.

Figure 5:
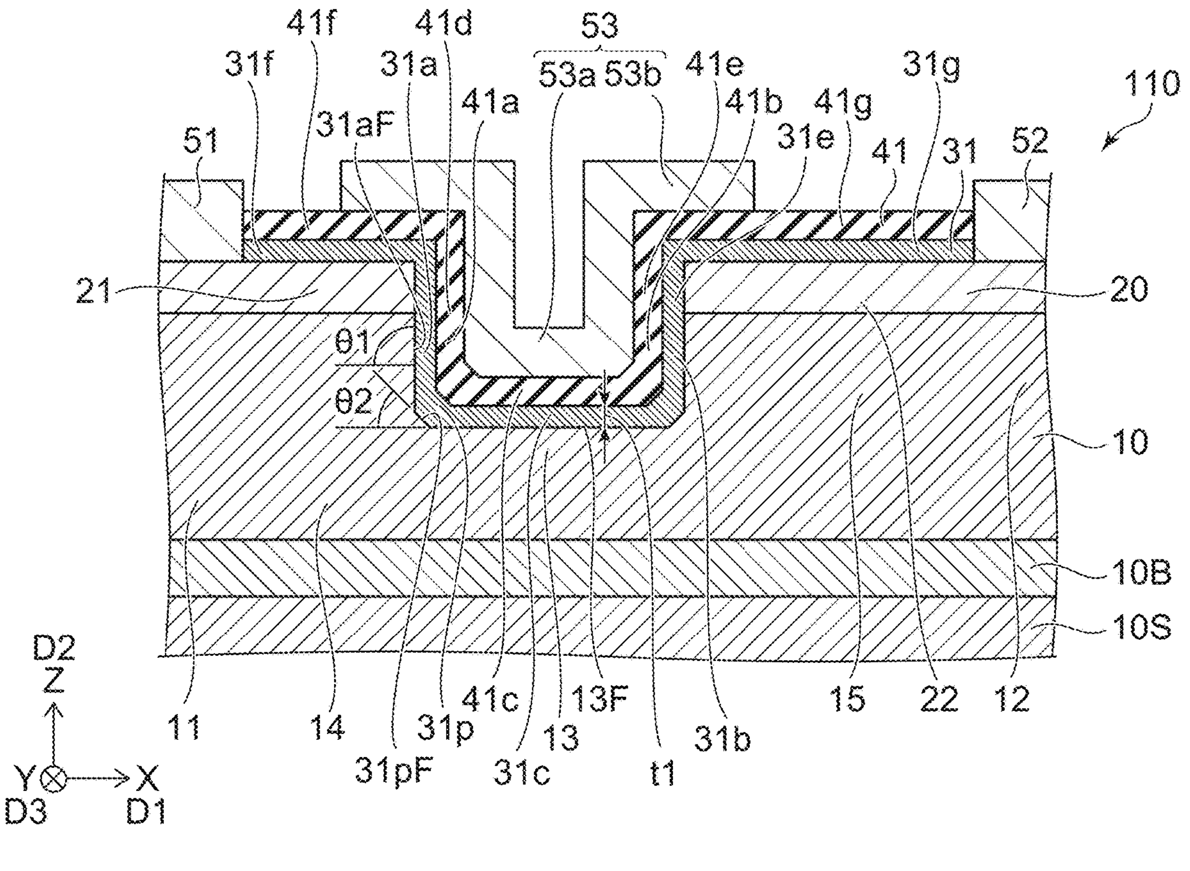
FIG. 5 is a schematic cross-sectional view illustrating the semiconductor device according to the first embodiment.

FIG. 5 is a schematic cross-sectional view illustrating the semiconductor device according to the first embodiment.

As shown in FIG. 5, in the semiconductor device 110, the compound member 31 may further include a first intermediate region 31*p*. The first intermediate region 31*p* is provided between the first region 31*a* and the third region 31*c*. The first intermediate region 31*p* includes a first intermediate region face 31*p*F facing the first semiconductor layer 10. The first intermediate region face 31*p*F is inclined with respect to the X-Y plane.

On the other hand, the first region 31*a* includes a first region face 31*a*F facing the fourth partial region 14. An angle between a plane (for example, the X-Y plane) perpendicular to the second direction D2 and the first region face 31*a*F is defined as a first angle θ1. An angle between the plane and the first intermediate region face 31*p*F is defined as a second angle θ2. The first angle θ1 is larger than the second angle θ2. By the second angle θ2 being small and the first intermediate region face 31*p*F being inclined, for example, a high threshold voltage can be easily obtained.

For example, the first angle θ1 is not less than 88 degrees and mot more than 90 degrees. For example, the second angle θ2 may be not less than 30 degrees and not more than 60 degrees.

As shown in FIG. 5, a thickness of the third region 31*c* along the second direction D2 is defined as the thickness t1. In the embodiment, the thickness t1 may be not less than 0.5 nm and not more than 5 nm. The thickness of the first region 31*a* along the first direction D1 may be substantially the same as the thickness t1. By such a thickness t1, it becomes easy to obtain the above-mentioned inter-plane spacing. For example, if the thickness of the compound member 31 having a high Al composition ratio is excessively large, the crystallinity tends to be low. If the thickness t1 is too thin, it is difficult to obtain a stable and continuous film shape in the compound member 31.

In embodiments, information regarding length and thickness is obtained from electron microscopy images and the like. Information regarding the composition of the material can be obtained by SIMS (Secondary Ion Mass Spectrometry), EDX (Energy dispersive X-ray spectroscopy), or the like. Information regarding the lattice length such as the inter-plane spacing can be obtained by electron diffraction, X-ray diffraction, or an electron microscope image.

Embodiments may include the following Technical proposals:

Technical Proposal 1

A semiconductor device, comprising:

a first electrode;

a second electrode;

a third electrode including a first electrode portion, a position of the third electrode in a first direction from the first electrode to the second electrode being between a position of the first electrode in the first direction and a position of the second electrode in the first direction;

a first semiconductor layer including $Al_{x1}Ga_{1-x1}N$ ($0 \le x1 < 1$), the first semiconductor layer including a first partial region, a second partial region, a third partial region, a fourth partial region, and a fifth partial region, a second direction from the first partial region to the first electrode crossing the first direction, a direction from the second partial region to the second electrode being along the second direction, a direction from the third partial region to the first electrode portion being along the second direction, a position of the fourth partial region in the first direction being between a position of the first partial region in the first direction and a position of the third partial region in the first direction, a position of the fifth partial region in the first direction being between the position of the third partial region in the first direction and a position of the second partial region in the first direction;

a second semiconductor layer including $Al_{x2}Ga_{1-x2}N$ ($0 < x2 < 1$, $x1 < x2$), the second semiconductor layer including a first semiconductor portion and a second semiconductor portion, a direction from the fourth partial region to the first semiconductor portion being along the second direction, a direction from the fifth partial region to the second semiconductor portion being along the second direction; and a compound member including $Al_{z1}Ga_{1-z1}N$ ($0 < z1 \le 1$, $x2 < z1$), the compound member including a first region, a second region, and a third region, the first region being between the fourth partial region and the first electrode portion in the first direction, the second region being between the first electrode portion and the fifth partial region in the first direction, the third region being between the third partial region and the first electrode portion, a first absolute value of a first difference between a (10-10) inter-plane spacing in the first region and a (10-10) inter-plane spacing in the fourth partial region being greater than a third absolute value of a third difference between a (10-10) inter-plane spacing in the third region and a (10-10) inter-plane spacing in the third partial region.

Technical Proposal 2

The semiconductor device according to Technical proposal 1, wherein the fourth partial region includes a first position and a second position, the first position is between the second position and the first region in the first direction, a distance in the first direction between the first position and the first region is 1 nm, a distance in the first direction between the second position and the first region is 10 nm, and an absolute value of a difference between a (10-10) inter-plane spacing at the first position and a (10-10) interplane spacing at the second position is smaller than the first absolute value.

Technical Proposal 3

The semiconductor device according to Technical proposal 1 or 2, wherein the third partial region includes a third position and a fourth position, the third position is between the fourth position and the third region in the second direction, a distance in the first direction between the third position and the third region is 1 nm, a distance in the first direction between the fourth position and the third region is 10 nm, and an absolute value of a difference between a (10-10) inter-plane spacing at the third position and a (10-10) inter-plane spacing at the fourth position is smaller than the first absolute value.

Technical Proposal 4

The semiconductor device according to any one of Technical proposals 1-3, wherein the third partial region includes a third partial region plane facing the third region, and the third partial region plane is along a c-plane of the first semiconductor layer.

Technical Proposal 5

The semiconductor device according to any one of Technical proposals 1-3, wherein the first absolute value is not less than two times and not more than 50 times the third absolute value.

Technical Proposal 6

The semiconductor device according to any one of Technical proposals 1-4, wherein the first absolute value is 0.002 nm or more, and the third absolute value is less than 0.001 nm.

Technical Proposal 7

The semiconductor device according to any one of Technical proposals 1-5, wherein a ratio of the third absolute value to the (10-10) inter-plane spacing at the third partial region is not more than 0.001.

Technical Proposal 8

The semiconductor device according to any one of Technical proposals 1-6, wherein an absolute value of a difference between the (0001) inter-plane spacing in the first region and the (0001) inter-plane spacing in the fourth partial region is greater than the third absolute value.

Technical Proposal 9

The semiconductor device according to any one of Technical proposals 1-7, wherein an absolute value of a difference between the (0001) inter-plane spacing in the third region and the (0001) inter-plane spacing in the third partial region is greater than the third absolute value.

Technical Proposal 10

The semiconductor device according to any one of Technical proposals 1-9, wherein
the compound member further includes a fourth region and a fifth region,
the fourth region is in contact with the first semiconductor portion, and
the fifth region is in contact with the second semiconductor portion.

Technical Proposal 11

The semiconductor device according to Technical proposal 10, wherein
the compound member further includes a sixth region and a seventh region,
the first semiconductor portion is provided between the fourth partial region and the sixth region, and
the second semiconductor portion is provided between the fifth partial region and the seventh region.

Technical Proposal 12

The semiconductor device according to any one of Technical proposals 1-11, further comprising:
a first insulating member,
the first insulating member including a first insulating region, a second insulating region, and a third insulating region,
the first insulating region being provided between the first region and the first electrode portion in the first direction,
the second insulating region being provided between the first electrode portion and the second region in the first direction, and
the third insulating region being provided between the third region and the first electrode portion in the second direction.

Technical Proposal 13

The semiconductor device according to any one of Technical proposals 1-3, wherein
the first semiconductor portion includes a first face and a first other face;
the first face is between the fourth partial region and the first other face in the second direction,
the first face faces fourth partial region,
the third partial region includes a third partial region plane facing the third region,
a distance in the second direction between a position of the third partial region face in the second direction and a position of the first other face in the second direction is 100 nm or more.

Technical Proposal 14

The semiconductor device according to any one of Technical proposals 1-13, wherein
the compound member further includes a first intermediate region,
the first intermediate region is provided between the first region and the third region,
the first intermediate region includes a first intermediate region surface facing the first semiconductor layer,
the first region includes a first region face facing the fourth partial region, and
a first angle between a plane perpendicular to the second direction and the first region face is larger than a second angle between the plane and the first intermediate region surface.

Technical Proposal 15

The semiconductor device according to any one of Technical proposals 1-13, wherein
the first region includes a first region face facing the fourth partial region, and
the first region face is a nonpolar plane or a semipolar plane.

Technical Proposal 16

The semiconductor device according to any one of Technical proposals 1-15, wherein
a thickness of the third region along the second direction is not less than 0.5 nm and not more than 5 nm.

Technical Proposal 17

The semiconductor device according to any one of Technical proposals 1-16, wherein
a first distance along the first direction between the fourth partial region and the first electrode portion is not less than 0.8 times and not more than 1.2 times a second distance along the second direction between the third partial region and the first electrode portion.

Technical Proposal 18

The semiconductor device according to any one of Technical proposals 1-17, wherein
the first electrode is electrically connected to the first semiconductor portion, and
the second electrode is electrically connected to the second semiconductor portion.

Technical Proposal 19

The semiconductor device according to any one of Technical proposals 1-18, wherein
the x1 is not less than 0 and not more than 0.05,
the x2 is not less than 0.15 and not more than 0.35, and
the z1 is not less than 0.9 and not more than 1.

Technical Proposal 20

The semiconductor device according to Technical proposal 19, wherein
the z1 is 1.

According to the embodiment, a semiconductor device with improved characteristics can be provided.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in the semiconductor device such as electrodes, semiconductor layers, compound members, insulating members, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices practicable by an appropriate design modification by one skilled in the art based on the semiconductor devices described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:

a first electrode;

a second electrode;

a third electrode including a first electrode portion, a position of the third electrode in a first direction from the first electrode to the second electrode being between a position of the first electrode in the first direction and a position of the second electrode in the first direction;

a first semiconductor layer including $Al_{x1}Ga_{1-x1}N$ ($0 \le x1 < 1$), the first semiconductor layer including a first partial region, a second partial region, a third partial region, a fourth partial region, and a fifth partial region, a second direction from the first partial region to the first electrode crossing the first direction, a direction from the second partial region to the second electrode being along the second direction, a direction from the third partial region to the first electrode portion being along the second direction, a position of the fourth partial region in the first direction being between a position of the first partial region in the first direction and a position of the third partial region in the first direction, a position of the fifth partial region in the first direction being between the position of the third partial region in the first direction and a position of the second partial region in the first direction;

a second semiconductor layer including $Al_{x2}Ga_{1-x2}N$ ($0 < x2 < 1$, $x1 < x2$), the second semiconductor layer including a first semiconductor portion and a second semiconductor portion, a direction from the fourth partial region to the first semiconductor portion being along the second direction, a direction from the fifth partial region to the second semiconductor portion being along the second direction; and a compound member including $Al_{z1}Ga_{1-z1}N$ ($0 < z1 \le 1$, $x2 < z1$), the compound member including a first region, a second region, and a third region, the first region being between the fourth partial region and the first electrode portion in the first direction, the second region being between the first electrode portion and the fifth partial region in the first direction, the third region being between the third partial region and the first electrode portion, a first absolute value of a first difference between a (10-10) inter-plane spacing in the first region and a (10-10) inter-plane spacing in the fourth partial region being greater than a third absolute value of a third difference between a (10-10) inter-plane spacing in the third region and a (10-10) inter-plane spacing in the third partial region.

2. The device according to claim 1, wherein the fourth partial region includes a first position and a second position, the first position is between the second position and the first region in the first direction, a distance in the first direction between the first position and the first region is 1 nm, a distance in the first direction between the second position and the first region is 10 nm, and an absolute value of a difference between a (10-10) inter-plane spacing at the first position and a (10-10) interplane spacing at the second position is smaller than the first absolute value.

3. The device according to claim 1, wherein the third partial region includes a third position and a fourth position, the third position is between the fourth position and the third region in the second direction, a distance in the first direction between the third position and the third region is 1 nm, a distance in the first direction between the fourth position and the third region is 10 nm, and an absolute value of a difference between a (10-10) inter-plane spacing at the third position and a (10-10) inter-plane spacing at the fourth position is smaller than the first absolute value.

4. The device according to claim 1, wherein the third partial region includes a third partial region plane facing the third region, and the third partial region plane is along a c-plane of the first semiconductor layer.

5. The device according to claim 1, wherein the first absolute value is not less than two times and not more than 50 times the third absolute value.

6. The device according to claim 1, wherein the first absolute value is 0.002 nm or more, and the third absolute value is less than 0.001 nm.

7. The device according to claim 1, wherein a ratio of the third absolute value to the (10-10) interplane spacing at the third partial region is not more than 0.001.

8. The device according to claim 1, wherein an absolute value of a difference between the (0001) inter-plane spacing in the first region and the (0001) inter-plane spacing in the fourth partial region is greater than the third absolute value.

9. The device according to claim 7, wherein an absolute value of a difference between the (0001) inter-plane spacing in the third region and the (0001) inter-plane spacing in the third partial region is greater than the third absolute value.

10. The device according to claim 1 wherein the compound member further includes a fourth region and a fifth region,
the fourth region is in contact with the first semiconductor portion, and
the fifth region is in contact with the second semiconductor portion.

11. The device according to claim 10, wherein the compound member further includes a sixth region and a seventh region,
the first semiconductor portion is provided between the fourth partial region and the sixth region, and
the second semiconductor portion is provided between the fifth partial region and the seventh region.

12. The device according to claim 1, further comprising:
a first insulating member,
the first insulating member including a first insulating region, a second insulating region, and a third insulating region,
the first insulating region being provided between the first region and the first electrode portion in the first direction,
the second insulating region being provided between the first electrode portion and the second region in the first direction, and
the third insulating region being provided between the third region and the first electrode portion in the second direction.

13. The device according to claim 1, wherein the first semiconductor portion includes a first face and a first other face;
the first face is between the fourth partial region and the first other face in the second direction,
the first face faces fourth partial region,
the third partial region includes a third partial region plane facing the third region,
a distance in the second direction between a position of the third partial region face in the second direction and a position of the first other face in the second direction is 100 nm or more.

14. The device according to claim 1, wherein the compound member further includes a first intermediate region,
the first intermediate region is provided between the first region and the third region,
the first intermediate region includes a first intermediate region surface facing the first semiconductor layer,
the first region includes a first region face facing the fourth partial region, and
a first angle between a plane perpendicular to the second direction and the first region face is larger than a second angle between the plane and the first intermediate region surface.

15. The device according to claim 1, wherein the first region includes a first region face facing the fourth partial region, and
the first region face is a nonpolar plane or a semipolar plane.

16. The device according to claim 1, wherein a thickness of the third region along the second direction is not less than 0.5 nm and not more than 5 nm.

17. The device according to claim 1, wherein a first distance along the first direction between the fourth partial region and the first electrode portion is not less than 0.8 times and not more than 1.2 times a second distance along the second direction between the third partial region and the first electrode portion.

18. The device according to claim 1, wherein the first electrode is electrically connected to the first semiconductor portion, and
the second electrode is electrically connected to the second semiconductor portion.

19. The device according to claim 1, wherein the x1 is not less than 0 and not more than 0.05,
the x2 is not less than 0.15 and not more than 0.35, and
the z1 is not less than 0.9 and not more than 1.

20. The device according to claim 19, wherein the z1 is 1.

* * * * *